(12) United States Patent
Ueno et al.

(10) Patent No.: US 10,054,648 B2
(45) Date of Patent: Aug. 21, 2018

(54) POWER SOURCE VOLTAGE DETECTION APPARATUS

(71) Applicant: KEIHIN CORPORATION, Shinjuku-ku, Tokyo (JP)

(72) Inventors: Shugo Ueno, Utsunomiya (JP); Kazutaka Senoo, Utsunomiya (JP); Kouji Suzuki, Natori (JP)

(73) Assignee: KEIHIN CORPORATION, Tokyo (JP)

( * ) Notice: Subject to any disclaimer, the term of this patent is extended or adjusted under 35 U.S.C. 154(b) by 340 days.

(21) Appl. No.: 14/877,288

(22) Filed: Oct. 7, 2015

(65) Prior Publication Data

US 2016/0131690 A1 May 12, 2016

(30) Foreign Application Priority Data

Oct. 17, 2014 (JP) ................................ 2014-212669

(51) Int. Cl.
 *G01R 31/40* (2014.01)
 *G01R 19/165* (2006.01)
 (Continued)

(52) U.S. Cl.
 CPC ....... *G01R 31/40* (2013.01); *G01R 19/16538* (2013.01); *G01R 19/16542* (2013.01); *G01R 31/024* (2013.01); *G01R 31/04* (2013.01)

(58) Field of Classification Search
 None
 See application file for complete search history.

(56) References Cited

U.S. PATENT DOCUMENTS

| 5,994,927 A * | 11/1999 | Naito ..................... H03K 5/153 327/72 |
| 2014/0306717 A1* | 10/2014 | Feenstra ................ G01R 31/08 324/543 |

FOREIGN PATENT DOCUMENTS

| JP | 09080106 A | 3/1997 |
| JP | 2001124805 A | 5/2001 |

(Continued)

OTHER PUBLICATIONS

Notice of Reasons for Rejection for corresponding JP Application No. 2014-212669; dated May 29, 2018.

*Primary Examiner* — Vincent Q Nguyen
(74) *Attorney, Agent, or Firm* — Cantor Colburn LLP

(57) ABSTRACT

A power source voltage detection apparatus is provided, including a reference voltage generator connected to a differential amplifier via a first transmission line and decreases a power source voltage of a direct current power source to output a power source reference voltage, the first transmission line transmitting the power source reference voltage as a first power source voltage detection voltage; a standard voltage generator connected to the differential amplifier via a second transmission line and outputs a predetermined standard voltage, the second transmission line transmitting the standard voltage as a second power source voltage detection voltage; the differential amplifier differentially amplifying the first and second power source voltage detection voltages; and an abnormality detector which, based on the first and second power source voltage detection voltages, detects the power source voltage and detects an abnormality of the first transmission line and/or the second transmission line.

4 Claims, 3 Drawing Sheets

(51) Int. Cl.
 *G01R 31/02* (2006.01)
 *G01R 31/04* (2006.01)

(56) References Cited

FOREIGN PATENT DOCUMENTS

| | | | |
|---|---|---|---|
| JP | 2002156392 | A | 5/2002 |
| JP | 2002343445 | A | 11/2002 |
| JP | 2007285714 | A | 11/2007 |
| JP | 2009236711 | A | 10/2009 |

* cited by examiner

POWER SOURCE VOLTAGE DETECTION APPARATUS

CROSS REFERENCE TO RELATED APPLICATIONS

The present invention claims priority under 35 U.S.C. § 119 to Japanese Application No. 2014-212669, filed Oct. 17, 2014, the entire content of which is incorporated herein by reference.

FIELD OF THE INVENTION

Embodiments of the present invention relate to power source voltage detection apparatuses.

RELATED ART

For example, JP H09-080106A discloses the related-art apparatus for detecting an abnormality of a stray direct current power source that can detect a grounding of a stray direct current source and a power source voltage with a simple configuration. The above-mentioned apparatus includes a series resistance circuit, wherein four standard resistance elements Ra, Rb, Rc, Rd are connected in series between the positive pole and the negative pole of the stray direct current power source and resistance values of two resistive elements Ra, Rd on the positive and negative pole sides are equal to each other, and resistance values of two resistive elements Rb, Rc between the elements Ra and Rd are also equal to each other; a standard voltage application circuit which applies a standard direct current voltage to a connecting point of the two resistive elements Rb and Rc, wherein a part of the standard voltage application circuit is grounded; a grounding detector which adds a potential Vab at a connecting point of the two resistive elements Ra and Rb and a potential Vcd of a connecting point of the other two resistive elements Rc and Rd in the same phase and detects a grounding of the stray direct current power source based on the added value in the same phase; and a voltage detector which differentially amplifies the potentials Vab and Vcd and detects a voltage of the stray direct current power source based on a change of the differentially amplified value.

Now, the above-described related-art apparatus detects the power source voltage of the stray direct current power source and each of the grounding on the positive pole side (a wiring, etc., connected to a positive pole terminal) and the grounding on the negative pole side (a wiring, etc., connected to a negative pole terminal) in the stray direct current power source.

However, when there is a wiring abnormality (grounding, wire disconnection) between the stray direct current power source and the voltage detector (control unit), the power source voltage of the stray direct current power source may not be detected accurately and/or reliably. To accurately and/or reliably detect the power source voltage of the stray direct current power source, it is necessary to detect the abnormality of the transmission line of a voltage (a power source voltage detection voltage) which is required for a power source voltage such as the potentials Vab and Vcd.

SUMMARY

In light of the above-described circumstances, an object of embodiments of the present invention is to detect an occurrence of an abnormality of a transmission line of a power source voltage detection voltage when detecting a power source voltage of a direct current power source.

In order to achieve the above-described object, a power source voltage detection apparatus is provided according to one embodiment of the present invention, including: a reference voltage generator which is connected to a differential amplifier via a first transmission line and which decreases a power source voltage of a direct current power source to output a power source reference voltage, wherein the first transmission line transmits the power source reference voltage as a first power source voltage detection voltage; a standard voltage generator which is connected to the differential amplifier via a second transmission line and which outputs a predetermined standard voltage, wherein the second transmission line transmits the standard voltage as a second power source voltage detection voltage; the differential amplifier which differentially amplifies the first power source voltage detection voltage and the second power source voltage detection voltage; and an abnormality detector which, based on the first power source voltage detection voltage and the second power source voltage detection voltage, detects the power source voltage and detects an abnormality of the first transmission line and/or the second transmission line.

In the power source voltage detection apparatus according to one embodiment of the present invention, the abnormality detector operates on a voltage in which the standard voltage and the power source reference voltage are differentially amplified at a predetermined amplification degree as a disconnection determination voltage and detects the abnormality of the first transmission line and/or the second transmission line based on the disconnection determination voltage and the first power source voltage detection voltage and the second power source voltage detection voltage.

In the power source voltage detection apparatus according to one embodiment of the present invention, the differential amplifier has a predetermined amplification degree; and the abnormality detector takes in an output voltage of the differential amplifier as the disconnection determination voltage and detects the abnormality of the first transmission line and/or the second transmission line based on the disconnection determination voltage and the first power source voltage detection voltage and the second power source voltage detection voltage.

A method of power source voltage detection is provided according to one embodiment of the present invention, including decreasing, by a reference voltage generator which is connected to a differential amplifier via a first transmission line, a power source voltage of a direct current power source to output a power source reference voltage, wherein the power source reference voltage is transmitted as a first power source voltage detection voltage via the first transmission line; outputting, by a standard voltage generator which is connected to the differential amplifier via a second transmission line, a predetermined standard voltage and transmitting the standard voltage as a second power source voltage detection voltage via a second transmission line, wherein the standard voltage as a second power source voltage detection voltage via the second transmission line; differentially amplifying, by the differential amplifier, the first power source voltage detection voltage and the second power source voltage detection voltage; and, based on the first power source voltage detection voltage and the second power source voltage detection voltage, detecting, by an abnormality detector, the power source voltage and detecting an abnormality of the first transmission line and/or the second transmission line.

In the method of power source voltage detection according to one embodiment of the present invention, the method further includes, in the detecting, operating on a voltage in which the standard voltage and the power source reference voltage are differentially amplified at a predetermined amplification degree as a disconnection determination voltage and detecting the abnormality of the first transmission line and/or the second transmission line based on the disconnection determination voltage and the first power source voltage detection voltage and the second power source voltage detection voltage.

In the method of power source voltage detection according to one embodiment of the present invention, the differential amplifier has a predetermined amplification degree and the method further includes, in the detecting, taking in an output voltage of the differential amplifier as the disconnection determination voltage and detecting the abnormality of the first transmission line and/or the second transmission line based on the disconnection determination voltage and the first power source voltage detection voltage and the second power source voltage detection voltage.

Embodiments of the present invention make it possible to detect an abnormality of a transmission line based on first and second power source voltage detection voltages when detecting a power source voltage of the direct current power source based on the first and second power source voltage detection voltages with an abnormality detection device.

DETAILED DESCRIPTION OF THE INVENTION

Below, one embodiment of the present invention is described with reference to the drawings.

Figure 1:
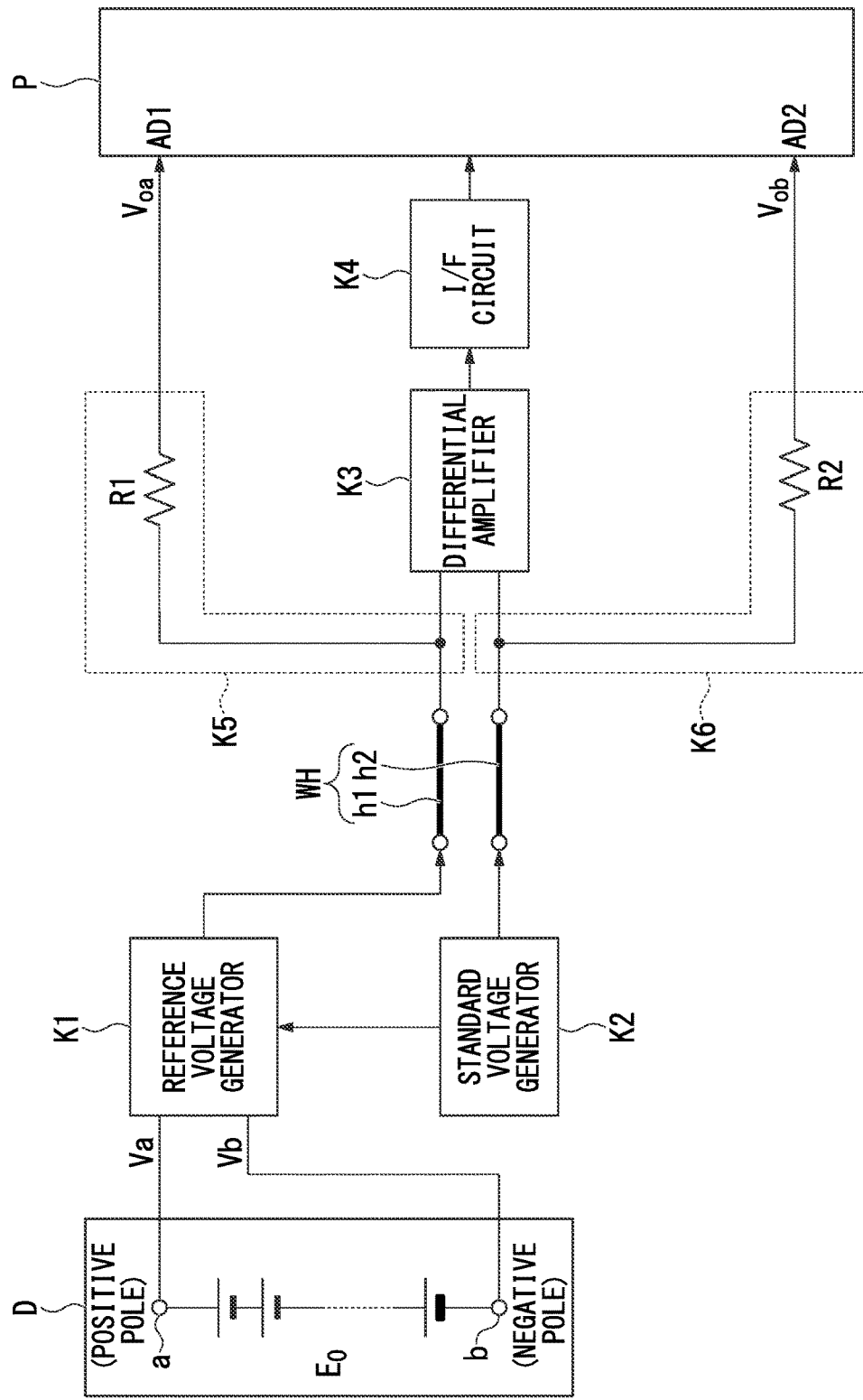
FIG. 1 is a circuit diagram illustrating an electrical configuration of a power source voltage detection apparatus according to one embodiment of the present invention.

As shown in FIG. 1, a power source voltage detection apparatus according to one embodiment of the present invention (below-called the present power source voltage detection apparatus) includes a reference voltage generator K1; a standard voltage generator K2; a wire harness WH (transmission lines); a differential amplifier K3; an I/F circuit K4; a first voltage supply circuit K5; a second voltage supply circuit K6; and an operation device P (an abnormality detector).

Such a direct current power source D in FIG. 1 is a detection subject of the present power source abnormality detection apparatus. This direct current power source D is an assembled cell, in which a large number of cell batteries are connected in series and a high voltage of a few hundred volts is supplied to an external load as an inter-terminal voltage (a power source voltage E0) between a positive pole terminal a and a negative pole terminal b.

A direct current power source D in FIG. 1 is a fuel cell or a lithium-ion cell, or in other words, a secondary cell, which supplies direct current power of the power source voltage E0 to a traveling motor (load) in a vehicle such as an electric automobile, a hybrid automobile, etc., for example. The above-described power source voltage E0 changes in a range of 0-500V as shown on the horizontal axis in FIG. 2, for example, in accordance with the charging state of the power source and the travelling state of a vehicle. Of the range in which the power source voltage E0 changes, a range of 430-500V, for example, is an excess voltage range, which is abnormal as the power source voltage E0, while a range other than the excess voltage range is a normal voltage range.

Figure 2:
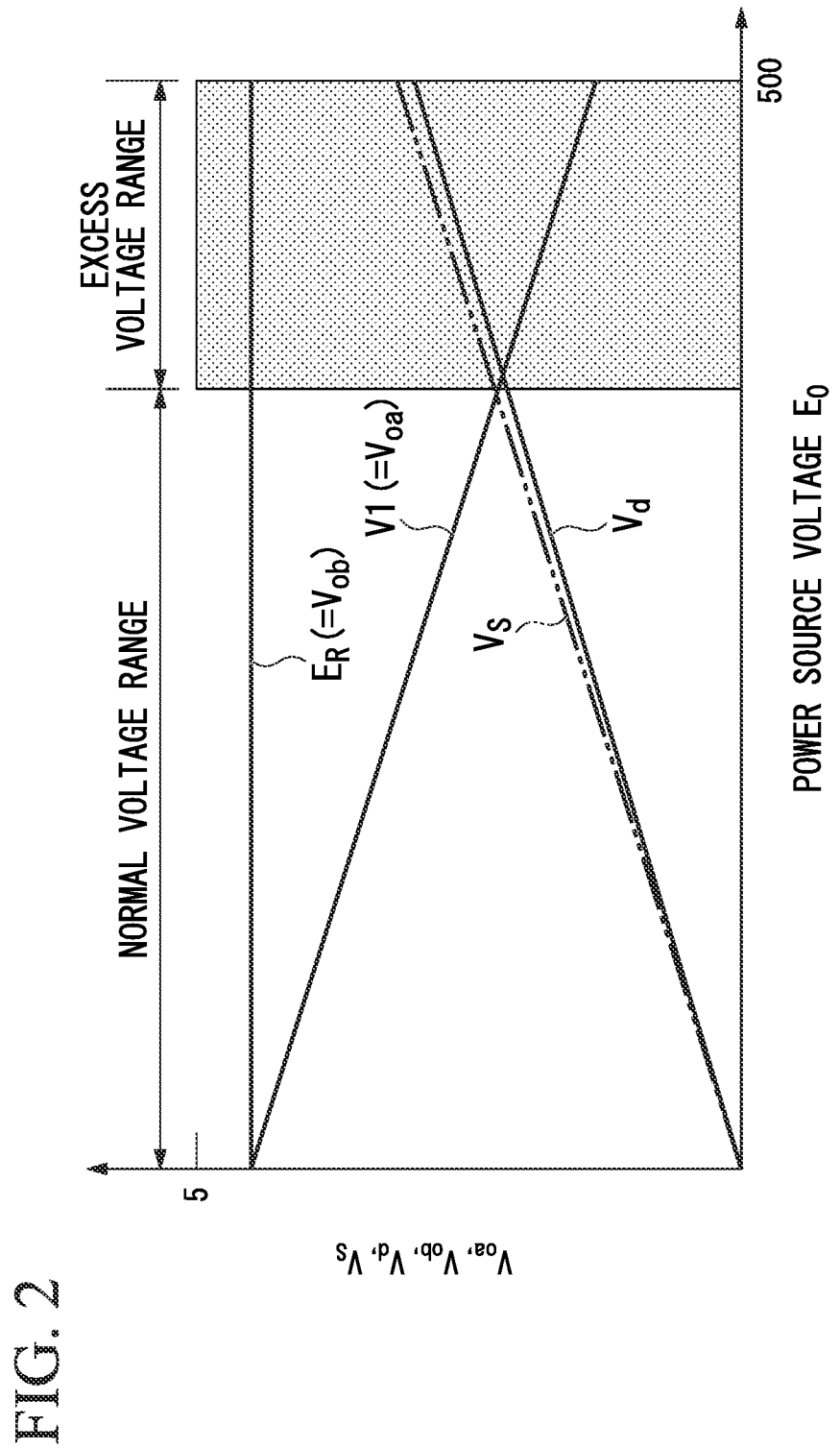
FIG. 2 is a graph illustrating various voltages at a normal time of a wire harness WH (transmission lines) in the power source voltage detection apparatus according to one embodiment of the present invention.

The reference voltage generator K1 lowers the power source voltage E0 to generate a power source reference voltage V1 and the power source reference voltage V1 is output to one end of a first electric wire h1 of the wire harness WH. This reference voltage generator K1, for example, divides a positive pole voltage Va of the direct current power source D by a resistor, divides a negative pole voltage Vb of the direct current power source D by a resistor, and outputs a differential voltage of the respective divided voltage values as the power source reference voltage V1. As shown in FIG. 2, when the power source voltage E0 changes in a range of 0-500V, the power source reference voltage V1 changes linearly.

The standard voltage generator K2 generates a predetermined standard voltage ER to supply the generated predetermined standard voltage ER to one end of a second electric wire h2 of the wire harness WH. The predetermined standard voltage ER is a voltage which specifies an operating point in an amplification operation of the differential amplifier K3. The reference voltage generator K1 also is arranged to take in the above-described standard voltage ER and generates the power source reference voltage V1 with the standard voltage ER as the operating point.

As shown, the wire harness WH includes at least the first electric wire h1 and the second electric wire h2. The present power source voltage detection apparatus is mounted to a high pressure substrate (printed wiring board) and a low pressure substrate (printed wiring board) which are electrically connected via the wire harness WH. The above-described reference voltage generator K1 and standard voltage generator K2 are mounted to the high pressure substrate which neighbors the direct current power source D. On the other hand, the differential amplifier K3, the first voltage supply circuit K5, the second voltage supply circuit K6, and the operation device P are mounted to the low pressure substrate within a cell ECU which is provided away from the direct current power source D.

The wire harness WH is a transmission line for electrically connecting such a high voltage substrate and a low voltage substrate. In this wire harness WH, the first electric wire h1 is a transmission line (signal line) over which the above-described power source reference voltage V1 is transmitted as a first power source voltage detection voltage from the high voltage substrate to the low voltage substrate. On the other hand, the second electric wire h2 is a transmission line (signal line) over which the above-described standard voltage ER is transmitted as a second power source voltage detection voltage from the high voltage substrate to the low voltage substrate. In the explanations below, the first power source voltage detection voltage is called a first detection voltage Voa, while the second power source voltage detection voltage is called a second detection voltage Vob.

The differential amplifier K3 differentially amplifies the first detection voltage Voa which is input from the first electric wire h1 and the second detection voltage Vob which is input from the second electric wire h2, and outputs the differentially-amplified result to the I/F circuit K4 as a disconnection determination voltage Vd. This differential amplifier K3 includes an operational amplifier and multiple resistors and is set to an amplification degree which is smaller than 1 by a predetermined amount. The I/F circuit K4 is an interface circuit which is provided between the differential amplifier K3 and the operation device P and converts a disconnection determination voltage Vd to a signal to output the converted result to the operation device P.

The first voltage supply circuit K5 is a circuit which supplies the first detection voltage Voa which is input from the first electric wire h1 to the operation device P. This first voltage supply circuit K5 includes a first resistor R1 as shown. In other words, one end of the first resistor R1 is connected to the other end of the first electric wire h1, while the other end of the first resistor R1 is connected to a second input terminal (AD1) of the operation device P.

The second voltage supply circuit K6 is a circuit which supplies the second detection voltage Vob which is input from the second electric wire h1 to the operation device P. This second voltage supply circuit K6 includes a second resistor R2 as shown. In other words, one end of the second resistor R2 is connected to the other end of the second electric wire h2, while the other end of the second resistor R2 is connected to a third input terminal (AD2) of the operation device P.

The operation device P is an abnormality detection device which detects an abnormality of the wire harness WH (transmission lines) based on the above-described first detection voltage Voa, second detection voltage Vob, and a disconnection determination voltage Vd. Moreover, this operation device P includes, as a basic function, a power source voltage detection function which detects the power source voltage E0 of the direct current power source D based on the first detection voltage Voa and the second detection voltage Vob.

In other words, this operation device P stores dedicated power source voltage detection programs and abnormality detection programs into an internal memory. Based on the first detection voltage Voa which is input from the first voltage supply circuit K5, the second detection voltage Vob which is input from the second voltage supply circuit K6, and the disconnection determination voltage Vd which is input from the differential amplifier K3, this operation device P detects the power source voltage E0 of the direct current power source D and detects the abnormality (grounding and/or disconnection) of the wire harness WH by software.

While details are described below, when the wire harness WH is normal, the first detection voltage Voa equals the power source reference voltage V1 and also the second detection voltage Vob equals the standard voltage ER. However, when the abnormality such as grounding and/or disconnection occurs in the wire harness WH, the first detection voltage Voa, the second detection voltage Vob, or the disconnection determination voltage Vd is a voltage which is different from that at the normal time of the wire harness WH.

Next, an operation of the present power source abnormality detection apparatus which is configured in this manner is described in detail with reference to FIGS. 2, 3A, 3B, 3C, and 3D.

When the wire harness WH is normal, the first detection voltage Voa equals the power source reference voltage V1 and, as shown in FIG. 2, changes linearly relative to a change of the power source voltage E0. The operation device P stores therein coefficients or tables which specify the correspondence between the first detection voltage Voa and the power source voltage E0, for example, and operates on the power source voltage E0 corresponding to the first detection voltage Voa using these coefficients or tables. Then, the operation device P performs a process of calculating the power source voltage E0 (a power voltage detection process) and a process of abnormality detection of the wire harness WH as described below.

In other words, as shown in FIG. 2, when the wire harness WH is normal, the first detection voltage Voa decreases linearly with an increase in the power source voltage E0. On the other hand, when the wire harness WH is normal, the second detection voltage Vob is equal to the standard voltage ER, so that it takes a constant value regardless of any change in the power source voltage E0. Moreover, the differential amplifier K3 outputs the disconnection determination voltage Vd, which increases linearly with an increase in the power source voltage E0.

In other words, when the wire harness WH is normal, or, in other words, when there is no occurrence of a grounding or a disconnection in the first electric wire h1 or the second electric wire h2, the first detection voltage Voa and the disconnection determination voltage Vd changes linearly as shown in FIG. 2 in a range in which the power source voltage E0 of the direct current power source D may take, while, on the other hand, the second detection voltage Vob maintains a constant value.

Here, a voltage Vs in FIG. 2 is a differential voltage (=Vob−Voa) between the first detection voltage Voa and the second detection voltage Vob. While the amplification degree of the differential amplifier K3 is set to a value which is somewhat lower than 1, the above-described differential voltage Vs corresponds to the output voltage of the differential amplifier K3 when the amplification degree of the differential amplifier K3 is set to 1. Such a differential voltage Vs increases linearly when the power source voltage E0 increases as shown in FIG. 2.

Figure 3A:
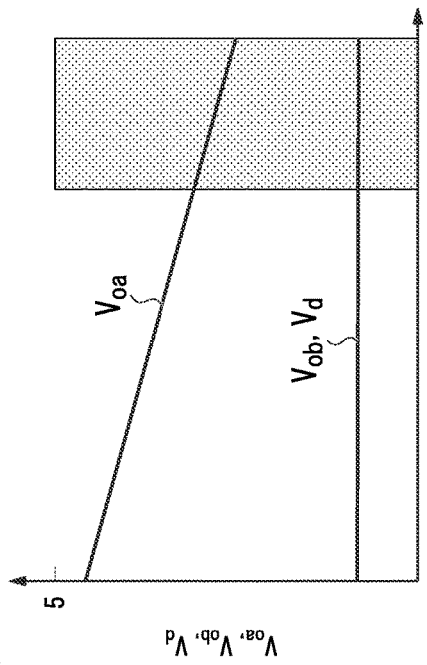
FIG. 3A-D is a graph illustrating various voltages at an abnormal time of the wire harness WH (the transmission lines) in the power source voltage detection apparatus according to one embodiment of the present invention.

Contrary to the above-described normal state of the wire harness WH, the potential of the first electric wire h1 takes a zero potential (ground potential) when an abnormality in which the first electric wire h1 is grounded occurs, so that the first detection voltage Voa takes 0V regardless of the value of the power source voltage E0 of the direct current power source D as shown in FIG. 3A. On the other hand, the second detection voltage Vob is not affected by the grounding of the first electric wire h1, so that it takes a constant value as in the normal state of the wire harness WH. Moreover, as the potential of the first electric wire h1 takes the zero potential (ground potential), the disconnection determination voltage Vd takes a constant value in the same manner as the second detection voltage Vob.

In other words, while the first detection voltage Voa takes a value within a predetermined range when the first electric wire h1 is normal, it takes 0V, which is different from the above-described predetermined range (normal range) in the whole range of the power source voltage E0 when grounding occurs with the first electric wire h1. To determine the presence/absence of the grounding of the first electric wire h1, the operation device P compares a specified threshold value and the first detection voltage Voa to thereby determine the presence/absence of the grounding of the first electric wire h1.

Here, if the first detection voltage Voa takes a potential within a normal range of the power source voltage E0 when the first electric wire 2 is grounded, the operation device P may not detect the grounding of the first electric wire h1 since it is not possible to determine whether the first detection voltage Voa is a potential based on the grounding of the first electric wire h1, or a potential based on the power source voltage E0 at that time, so that the grounding of the first electric wire h1 cannot be detected.

Figure 3B:
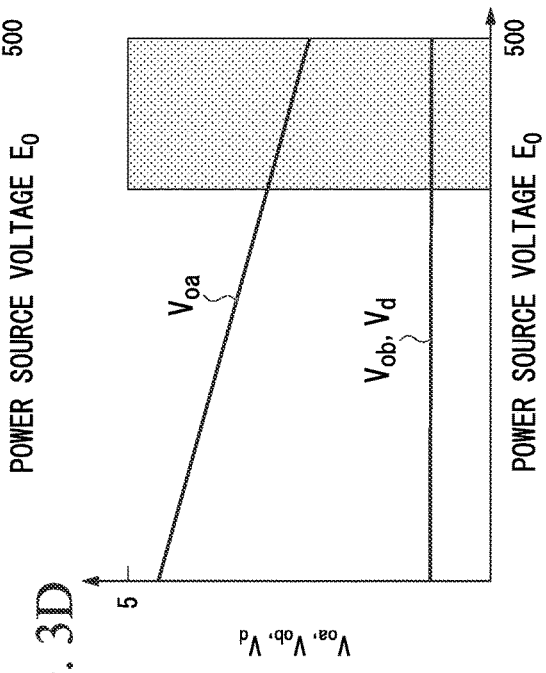

On the other hand, when the grounding occurs with the second electric wire h2, the potential of the second electric wire h2 takes a zero potential (ground potential), so that, as shown in FIG. 3B, the second detection voltage Vob takes 0V regardless of the value of the power source voltage E0. Moreover, the first detection voltage Voa takes a potential within a predetermined range as shown in FIG. 3B. Furthermore, the disconnection determination voltage Vd takes 0V, which is the same as the second detection voltage Vob.

In other words, when the second electric wire h2 is normal, the second detection voltage Vob takes a constant value, while, when the second electric wire h2 is grounded, it takes 0V, which is entirely different from the constant value. The operation device P compares a certain threshold value and the second detection voltage Vob to determine the presence/absence of the grounding of the second electric wire h2. Even in this case, the second detection voltage Vob takes a value which is entirely different between a potential when the grounding occurs in the second electric wire h2 and a potential when the second electric wire h2 is normal, so that the operation device P may detect the grounding of the second electric wire h2.

Figure 3C:
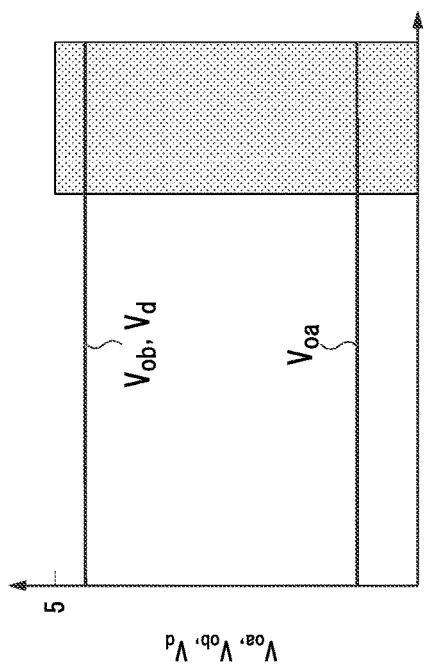
Figure 3D:
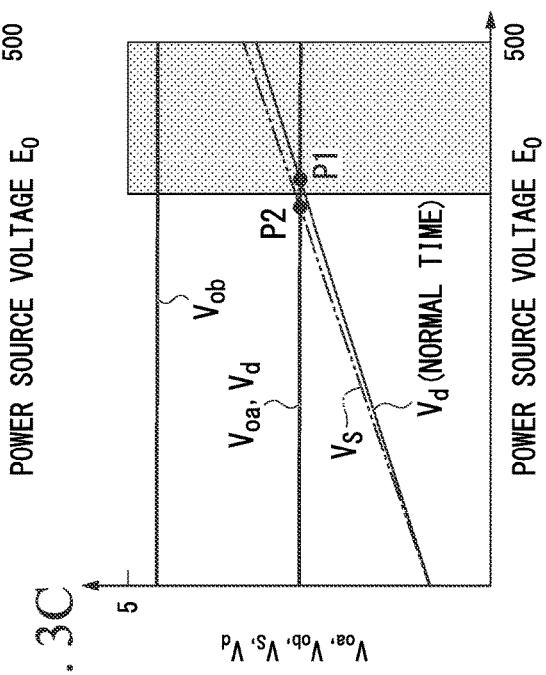

On the other hand, when the disconnection occurs with the first electric wire h1, the potential of a reverse input terminal (−) of an operational amplifier in the differential amplifier K3 takes the potential of a non-inverted input terminal (+) based on the well-known "imaginary short" principle in a general operational amplifier. As a result, the disconnection determination voltage Vd takes a specific value as shown in FIG. 3C. Moreover, in the same manner as the disconnection determination voltage Vd, the first detection voltage Voa also takes the above-described specific value. On the other hand, the second detection voltage Vob is not affected by the disconnection of the first electric wire h1, so that an inherent value is maintained.

Here, as shown in FIG. 3C, when viewed as the disconnection determination voltage Vd when the wire harness WH is normal, the above-described disconnection determination voltage Vd is a voltage value which belongs to an excess voltage range of the power source voltage E0 as shown with point P1. This voltage value is acquired by setting the amplification degree of the differential amplifier K3 to be lower than 1 as described above.

When the amplification degree of the differential amplifier K3 is set to 1, the disconnection determination voltage Vd takes a value which belongs to the normal voltage range of the power source voltage E0 as shown with a point P2 in FIG. 3C. Therefore, in this case, an occurrence of the disconnection in the first electric wire h1 cannot be determined normally. On the other hand, according to the present embodiment, as described above, the amplification degree of the differential amplifier K3 may be set to lower than 1 by a predetermined amount, so that the disconnection determination voltage Vd is adjusted such that it belongs to the excess voltage range of the power source voltage E0 if a disconnection occurs in the first electric wire h1, making it possible to normally determine an occurrence of a disconnection of the first electric wire h1.

On the other hand, when a disconnection occurs with the second electric wire h2, the potential of the non-inverting input terminal (+) of the operational amplifier in the differential amplifier K3 takes 0V, so that the disconnection determination voltage Vd which is input to the first input terminal (AD1) takes 0V. On the other hand, the first detection voltage Voa takes the same potential as that at the normal time of the wire harness WH. Moreover, the second detection voltage Vob takes 0V in the same manner as the disconnection determination voltage Vd.

In other words, if a disconnection occurs in the second electric wire h2, the disconnection determination voltage Vd, the first detection voltage Voa, and the second detection voltage Vob take a value which is similar to a value when a grounding occurs in the first electric wire h1. The operation device P compares the disconnection determination voltage Vd with a predetermined threshold value and determines the presence/absence of the disconnection of the second electric wire h2.

The present embodiment makes it possible to detect the power source voltage E0 in the operation device P (abnormality detection device) and determine the abnormality of the wire harness WH in the operation device P, or in other words, the grounding and the disconnection of the first electric wire h1 and the grounding and the disconnection of the second electric wire h2.

The present embodiment makes it possible to determine the abnormality of the wire harness WH in the operation device P, or in other words, the grounding and the disconnection of the first electric wire h1 and the grounding and the disconnection of the second electric wire h2.

The present invention is not limited to the above-described embodiments, so that the below-described variations are possible, for example.

(1) While the amplification degree of the differential amplifier K3 is set smaller than 1 by a predetermined amount to cause the disconnection determination voltage Vd when a disconnection occurs in the first electric wire h1 to belong to the excess voltage range of the power source voltage E0 in the above-described embodiment, the present invention is to limited thereto. For example, within the operation device P, the first detection voltage Voa and the second detection voltage Vob may be differentially amplified with the amplification degree which is smaller than 1 by a predetermined amount to operate on the disconnection determination voltage Vd. In this case, an effect of variation of the resistance value of the resistor which specifies the amplification degree of the differential amplifier K3 can be eliminated to more accurately determine the presence/absence of the disconnection of the first electric wire h1.

(2) While the above-described embodiment includes a differential amplifier which decrease the positive pole voltage and the negative pole voltage of the direct current power source D as the reference voltage generator K1, the present invention is not limited thereto. Various circuit configurations are possible as the reference voltage generator K1, so that they may include a configuration in which a resistor voltage-divider and a resistor adder are combined, for example.

(3) While the above-described embodiment includes setting the amplification degree of the differential amplifier K3 to smaller than 1 by a predetermined amount, the present invention is not limited thereto. For example, when only grounding of the first electric wire h1 and the second electric wire h2 may be detected as an abnormality of the wire harness WH (transmission lines), grounding of the first electric wire h1 and the second electric wire h2 may be detected by only the first detection voltage Voa and the second detection voltage Vob, so that it is not necessary to set the amplification degree of the differential amplifier K3 smaller than 1 by a predetermined amount.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A power source voltage detection apparatus, comprising:
a reference voltage generator which is connected to a differential amplifier via a first transmission line and which decreases a power source voltage of a direct current power source to output a power source reference voltage, wherein the first transmission line transmits the power source reference voltage as a first power source voltage detection voltage;
a standard voltage generator which is connected to the differential amplifier via a second transmission line and which outputs a predetermined standard voltage, wherein the second transmission line transmits the standard voltage as a second power source voltage detection voltage;
the differential amplifier which differentially amplifies the first power source voltage detection voltage and the second power source voltage detection voltage; and
an abnormality detector which, based on the first power source voltage detection voltage and the second power source voltage detection voltage, detects the power source voltage and detects an abnormality of the first transmission line and/or the second transmission line, wherein
the abnormality detector operates on a voltage in which the standard voltage and the power source reference voltage are differentially amplified at a predetermined amplification degree as a disconnection determination voltage and detects the abnormality of the first transmission line and/or the second transmission line based on the disconnection determination voltage and the first power source voltage detection voltage and the second power source voltage detection voltage.

2. The power source voltage detection apparatus as claimed in claim 1, wherein
the differential amplifier has a predetermined amplification degree; and
the abnormality detector takes in an output voltage of the differential amplifier as the disconnection determination voltage and detects the abnormality of the first transmission line and/or the second transmission line based on the disconnection determination voltage and the first power source voltage detection voltage and the second power source voltage detection voltage.

3. A method of power source voltage detection, comprising:
decreasing, by a reference voltage generator which is connected to a differential amplifier via a first transmission line, a power source voltage of a direct current power source to output a power source reference voltage, wherein the power source reference voltage is transmitted as a first power source voltage detection voltage via the first transmission line;
outputting, by a standard voltage generator which is connected to the differential amplifier via a second transmission line, a predetermined standard voltage and transmitting the standard voltage as a second power source voltage detection voltage via a second transmission line, wherein the standard voltage transmits the standard voltage as a second power source voltage detection voltage via the second transmission line;
differentially amplifying, by the differential amplifier, the first power source voltage detection voltage and the second power source voltage detection voltage; and,
based on the first power source voltage detection voltage and the second power source voltage detection voltage, detecting, by an abnormality detector, the power source voltage and detecting an abnormality of the first transmission line and/or the second transmission line, the method further comprising, in the detecting, operating on a voltage in which the standard voltage and the power source reference voltage are differentially amplified at a predetermined amplification degree as a disconnection determination voltage and detecting the abnormality of the first transmission line and/or the second transmission line based on the disconnection determination voltage and the first power source voltage detection voltage and the second power source voltage detection voltage.

4. The method of power source voltage detection as claimed in claim 3, wherein the differential amplifier has a predetermined amplification degree and the method further comprising, in the detecting, taking in an output voltage of the differential amplifier as the disconnection determination voltage and detecting the abnormality of the first transmission line and/or the second transmission line based on the disconnection determination voltage and the first power source voltage detection voltage and the second power source voltage detection voltage.

* * * * *